United States Patent [19]
Sato et al.

[11] Patent Number: 6,083,665
[45] Date of Patent: Jul. 4, 2000

[54] PHOTORESIST LAMINATE AND METHOD FOR PATTERNING USING THE SAME

[75] Inventors: Mitsuru Sato, Hillsboro, Oreg.; Katsumi Oomori, Yokohama, Japan; Etsuko Iguchi, Machida, Japan; Kiyoshi Ishikawa, Kanagawa-ken, Japan; Fumitake Kaneko, Hiratsuka, Japan; Toshimasa Nakayama, Chigasaki, Japan

[73] Assignee: Tokyo Ohka Kogyo Co., Ltd., Kanagawa-ken, Japan

[21] Appl. No.: 09/273,262

[22] Filed: Mar. 22, 1999

Related U.S. Application Data

[62] Division of application No. 08/924,260, Sep. 5, 1997, Pat. No. 5,925,495.

[30] Foreign Application Priority Data

Sep. 10, 1996 [JP] Japan ................................. 8-239590

[51] Int. Cl.⁷ ...................................................... G03F 7/40
[52] U.S. Cl. ............................................ 430/313; 430/325
[58] Field of Search ................................ 430/325, 271.1, 430/313

[56] References Cited

U.S. PATENT DOCUMENTS

| | | | |
|---|---|---|---|
| 4,540,598 | 9/1985 | Berner et al. | 427/54.1 |
| 4,736,055 | 4/1988 | Dietliker et al. | 560/13 |
| 5,019,488 | 5/1991 | Mammato et al. | 430/325 |
| 5,126,289 | 6/1992 | Ziger | 437/231 |
| 5,605,775 | 2/1997 | Watanabe | 430/5 |
| 5,627,011 | 5/1997 | Münzel et al. | 430/270.1 |
| 5,650,262 | 7/1997 | Münzel et al. | 430/270.1 |
| 5,693,691 | 12/1997 | Flaim et al. | 523/436 |
| 5,892,095 | 4/1999 | Hada et al. | 558/388 |
| 5,902,713 | 5/1999 | Hada et al. | 430/270.1 |

FOREIGN PATENT DOCUMENTS

| | | |
|---|---|---|
| 0 044 115 | 1/1982 | European Pat. Off. . |
| 0 241 423 | 10/1987 | European Pat. Off. . |
| 0 361 907 | 4/1990 | European Pat. Off. . |
| 635480 | 1/1995 | European Pat. Off. . |
| 0 768 572 | 4/1997 | European Pat. Off. . |
| 0 780 729 | 6/1997 | European Pat. Off. . |
| 8-87115 | 4/1996 | Japan . |

*Primary Examiner*—Janet Baxter
*Assistant Examiner*—Rosemary Ashton
*Attorney, Agent, or Firm*—Wenderoth, Lind & Ponack, L.L.P.

[57] ABSTRACT

A proposal is made for the photolithographic formation of a patterned resist layer on a substrate without the troubles due to reflection of the exposure light on the substrate surface. Thus, patterning is conducted on a photo-resist laminate comprising (a) a substrate; (b) a specific anti-reflection coating layer formed on one surface of the substrate; and (c) a photoresist layer formed on the anti-reflection coating layer from a specific negative-working chemical-sensitization photoresist composition. The patterning procedure comprises the steps of: (A) exposing, pattern-wise to actinic rays, the photoresist layer of the photoresist laminate; (B) subjecting the photoresist layer to a heat treatment; (C) subjecting the photoresist layer to a development treatment to dissolve away the photoresist layer in the areas unexposed to actinic rays in step (A) so as to expose bare the anti-reflection coating layer in the areas unexposed to the actinic rays leaving a patterned resist layer in the areas exposed to the actinic rays; and (D) removing the pattern-wise exposed anti-reflection coating layer by dry etching with the patterned photoresist layer as a mask.

1 Claim, No Drawings

PHOTORESIST LAMINATE AND METHOD FOR PATTERNING USING THE SAME

This is a divisional of Ser. No. 08/924,260, filed Sep. 5, 1997, U.S. Pat. No. 5,925,495.

BACKGROUND OF THE INVENTION

The present invention relates to a photoresist laminate and a method of patterning by using the same. More particularly, the invention relates to a photoresist laminate capable of giving a patterned resist layer of high pattern resolution having an excellently orthogonal cross sectional profile as well as to a method for the formation of a patterned resist layer by using the photoresist laminate.

It is a remarkable trend in recent years in the fields of manufacturing semiconductor devices along with the rapid increase in the degree of integration of the devices that the photolithographic patterning of a resist layer on a substrate is performed by using actinic rays having a shorter and shorter wavelength than in the prior art. Thus, the actinic rays as a major current in recent years used for the purpose include i-line light of 365 nm wavelength, deep ultraviolet light, excimer laser beams and the like. A problem accompanying the use of such short-wavelength actinic rays is that reflection of the actinic rays on the substrate surface bearing the photoresist layer is increased while the reflecting light causes a phenomenon of local distortion or notching of the patterned resist layer or a decrease of the dimensional accuracy of the pattern.

As a method for overcoming the troubles due to reflection of light on the substrate surface, a proposal is made to provide an anti-reflection film as an undercoating of the photoresist layer on the substrate surface to form a photoresist laminate. The photoresist composition currently under use in many cases with such an anti-reflection undercoating is a photoresist composition of the so-called chemical-sensitization type in view of the high photosensitivity and high pattern resolution obtained therewith. Chemical-sensitization photoresist compositions, which can be classified into positive-working and negative-working compositions, contain a radiation-sensitive acid-generating compound and a resinous film-forming ingredient which causes a decrease or increase, respectively, of the solubility in an aqueous alkaline solution by the catalytic activity of the acid generated from the acid-generating agent in the areas of the photoresist layer pattern-wise exposed to actinic rays.

The above mentioned resinous film-forming ingredient in the positive-working chemical-sensitization photoresist composition is usually an alkali-soluble resin such as a polyhydroxystyrene resin or a copolymeric resin of a hydroxystyrene and another styrene monomer in combination with an alkali-solubility reducing agent which causes an increase in the alkali solubility by reacting with an acid or an alkali-soluble resin such as a polyhydroxystyrene resin substituted for a part of the hydroxyl groups by alkali-solubility reducing groups.

The resinous film-forming ingredient in the negative-working chemical-sensitization photoresist composition, on the other hand, is a combination of an acid-crosslinkable compound and an alkali-soluble resin such as a polyhydroxystyrene resin or a copolymeric resin of a hydroxystyrene and another styrene monomer, optionally, substituted for a part of the hydroxyl groups by alkali-solubility reducing groups to be rendered alkali-insoluble.

When the above described chemical-sensitization photoresist composition or, in particular, the negative-working one is used for patterning as a photoresist laminate with an anti-reflection undercoating, it is sometimes the case that necking or constriction of the patterned photoresist layer at the interface with the anti-reflection undercoating layer sometimes occurs to affect the orthogonality of the cross sectional profile of the patterned resist layer. When the anti-reflection undercoating layer is to be removed by dry etching with such a poorly patterned resist layer as an etching mask, the etching treatment cannot be performed with high dimensional accuracy not to accomplish patterning with high pattern resolution.

SUMMARY OF THE INVENTION

The present invention accordingly has an object, in view of the above described problems, to provide a photoresist laminate capable of giving a patterned resist layer of high fidelity having an excellently orthogonal cross sectional profile without the troubles due to the reflecting light on the substrate surface as well as to provide an efficient method of patterning by using the photoresist laminate.

Thus, the photoresist laminate of the present invention is an integrally layered body which comprises:

(a) a substrate;

(b) an anti-reflection coating layer formed on one surface of the substrate; and (c) a photoresist layer formed on the anti-reflection coating layer from a negative-working chemical-sensitization photoresist composition comprising an oximesulfonate compound as a radiation-sensitive acid-generating agent.

Further, the method of the present invention for patterning by using the above defined photoresist laminate comprises the steps of:

(A) exposing the photoresist layer of the above defined photoresist laminate pattern-wise to actinic rays;

(B) subjecting the photoresist layer to a heat treatment;

(C) subjecting the photoresist layer to a development treatment to dissolve away the photoresist layer in the areas unexposed to actinic rays in step (A) so as to expose bare the surface of the anti-reflection coating layer in the areas unexposed to the actinic rays leaving a patterned resist layer in the areas exposed to the actinic rays; and (D) removing the anti-reflection coating layer in the areas exposed bare by dry etching with the patterned photoresist layer as an etching mask.

DETAILED DESCRIPTION OF THE PREFERRED EMBODIMENTS

As is described above, the photoresist laminate of the present invention has an anti-reflection coating layer as an intermediate layer between the substrate surface and the photoresist layer of a negative-working chemical-sensitization photoresist composition. The coating composition for forming the anti-reflection coating layer is not particularly limitative and can be freely selected from those used in conventional photoresist laminates. Suitable anti-reflection coating compositions include those comprising an ultraviolet absorbing compound and a crosslinking agent, those comprising an ultraviolet absorbing compound and a binder resin and those comprising an ultraviolet absorbing compound, a crosslinking agent and a binder resin.

The ultraviolet absorbing compound can be any one of benzophenone compounds, azomethine compounds, diphenylsulfone compounds and diphenylsulfoxide compounds and is exemplified by the benzophenone compounds such as:

2,2', 4,4'-tetrahydroxy benzophenone;
2-hydroxy-4'-dimethylamino benzophenone;
2,4-dihydroxy-4'-dimethylamino benzophenone;
2,4-dihydroxy-4'-diethylamino benzophenone;
4,4'-bis(diethylamino) benzophenone; and
4,4'-bis(dimethylamino) benzophenone, and
azomethine compounds such as:
3-hydroxy-N-(4-diethylaminobenzylidene) aniline;
2-hydroxy-N-(4-diethylaminobenzylidene) aniline;
2-methyl-4-hydroxy-N-(4-diethylaminobenzylidene) aniline;
3-hydroxy-4-methoxy-N-(4-diethylaminobenzylidene) aniline; and
4-diethylamino-N-(3-hydroxy-4-methoxybenzylidene) aniline, as well as the azomethine compounds expressed by the structural formulas

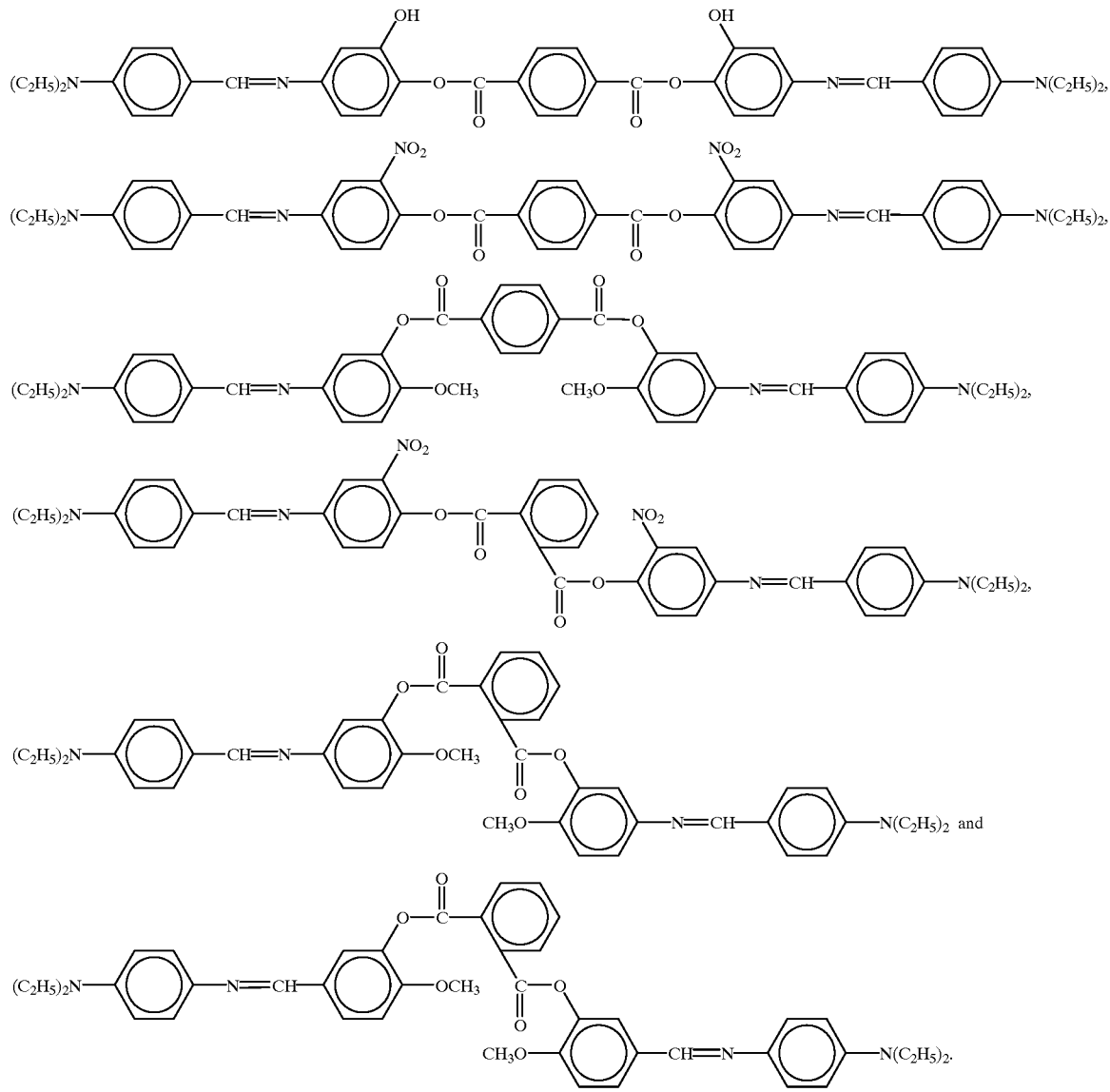

4-hydroxy-N-(4-diethylaminobenzylidene) aniline;
4-hydroxy-N-(4-diethylaminobenzylidene)-1-naphthylamine;
2-hydroxy-5-chloro-N-(4-diethylaminobenzylidene) aniline;
2,4-dihydroxy-N-(4-diethylaminobenzylidene) aniline;
3-nitro-4-hydroxy-N-(4-diethylaminobenzylidene) aniline;

Further, the ultraviolet absorbing compounds usable here include the diphenylsulfone compounds such as:
bis(2,4-dihydroxyphenyl)sulfone;
bis(3,6-dihydroxyphenyl)sulfone;
bis(3,4-dihydroxyphenyl)sulfone;
bis(3,5-dihydroxyphenyl)sulfone;
bis(4-hydroxyphenyl)sulfone;
bis(3-hydroxyphenyl)sulfone; and
bis(3,5-dimeth 1-4-hydroxyphenyl)sulfone, and
diphenylsulfoxide compounds such as:

bis(2,3-dihydroxyphenyl) sulfoxide;
bis(5-chloro-2,3-dihydroxyphenyl) sulfoxide;
bis(2,4-dihydroxyphenyl) sulfoxide;
bis(2,4-dihydroxy-6-methylphenyl) sulfoxide;
bis(5-chloro-2,4-dihydroxyphenyl) sulfoxide;
bis (2,5- dihydroxyphenyl) sulfoxide;
bis(3,4-dihydroxyphenyl) sulfoxide;
bis(3,5-dihydroxyphenyl) sulfoxide;
bis(2,3,4-trihydroxyphenyl) sulfoxide;
bis(2,3,4-trihydroxy-6-methylphenyl) sulfoxide;
bis(5-chloro-2,3,4-trihydroxyphenyl) sulfoxide;
bis(2,4,6-trihydroxyphenyl) sulfoxide; and
bis(5-chloro-2,4,6-trihydroxyphenyl) sulfoxide.

These ultraviolet absorbing compounds can be used either singly or as a combination of two kinds or more according to need.

The crosslinking agent contained in the anti-reflection coating composition has functional groups in the molecule capable of forming crosslinks between its own molecules per se or between its own molecules and the molecules of the ultraviolet absorbing compound and/or the binder resin. Suitable crosslinking compounds include nitrogen-containing organic compounds having at least two crosslinkable functional groups in a molecule such as hydroxyalkyl and alkoxyalkyl groups. Such a nitrogen-containing compound is exemplified by melamine, urea, guanamine, benzoguanamine, glycoluryl, succinylamide, ethyleneurea and the like substituted by methylol groups and/or alkoxymethyl groups for the hydrogen atoms of the amino groups. These methylol and/or alkoxymethyl group-containing nitrogen compounds can be prepared easily by the reaction of melamine, urea, guanamine, benzoguanamine, glycoluryl, succinylamide, ethyleneurea and the like with formaldehyde in boiling water to effect methylolation, optionally, followed by the reaction with a lower alcohol such as methyl, ethyl, propyl and isopropyl alcohols to effect alkoxylation of the methylol groups.

Among the above described nitrogen-containing compounds, particularly preferred are the triazine compounds represented by the general formula

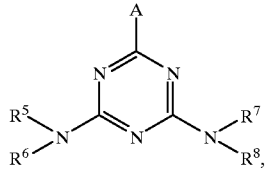

(I)

in which A is a hydrogen atom, alkyl group, aralkyl group, aryl group or an amino group of the formula —NR$^3$R$^4$ and R$^3$, R$^4$, R$^5$, R$^6$, R$^7$ and R$^8$ are each, independently from the others, a hydrogen atom, methylol group or alkoxymethyl group, more preferably, with the proviso that at least two of the groups denoted by R$^3$, R$^4$, R$^5$, R$^6$, R$^7$ and R$^8$ in a molecule are each a methylol group or alkoxymethyl group in respect of good crosslinkability.

Melamine compounds as a class of the triazine compounds represented by the general formula (I) should preferably have 3 to 6 methylol groups and/or alkoxymethyl groups on an average per triazine ring. Several commercial products of such a melamine compound are available on the market and can be used as such in the present invention including those sold under the trade names of Mx-750 (a product by Sanwa Chemical Co.), which is a melamine compound having 3.7 methoxymethyl groups on an average per melamine ring and Mw-30 (a product by Sanwa Chemical Co.), which is a melamine compound having 5.8 methoxymethyl groups on an average per melamine ring as well as benzoguanamine compounds sold under the trade names of Cymels (each a product by Mitsui Cyanamide Co.). These melamine compounds can be used in the form of a dimer or trimer. The above described compounds as the crosslinking agent can be used either singly or as a combination of two kinds or more according to need.

The binder resin to be combined with the ultraviolet absorbing compound is exemplified by polyamide acid resins, polysulfone resins, halogenated polymers, polyacetal resins, copolymeric acetal resins, α-substituted vinyl polymers, polyamine acid resins, polybutene sulfonic acid resins, acrylic resins and the like. Preferable acrylic resins include those polymers obtained from glycidyl acrylate, alkyl acrylates, such as methyl acrylate, ethyl acrylate and propyl acrylate, and 4-(4-hydroxyphenyl)sulfonylphenyl acrylate as well as methacrylic acid derivatives corresponding to these acrylates as the starting monomeric compounds. Particular examples of the acrylic resin include poly (glycidyl acrylate), poly(methyl acrylate), poly(ethyl acrylate), poly[4-(4-hydroxyphenyl)sulfonylphenyl acrylate] and copolymers of glycidyl acrylate and methyl acrylate as well as those polymers of methacrylic acid derivatives corresponding to the acrylic acid derivatives. Particularly preferable acrylic resins are copolymeric resins of glycidyl acrylate and methyl acrylate in a weight proportion of 2:8 to 8:2 or, more preferably, 3:7 to 7:3 and poly[4-(4-hydroxyphenyl)sulfonylphenyl acrylate] resins in respect of little occurrence of necking in the patterned resist layer at the interface with the anti-reflection coating layer.

It is optional that the anti-reflection coating layer contains, besides the above described ultraviolet absorbing agents, crosslinking agents and binder resins, various kinds of known additives including organic acids such as acetic acid, oxalic acid, maleic acid, o-hydroxy benzoic acid, 3,5-dinitro benzoic acid and 2,6-dihydroxy benzoic acid as well as a commercially available copolymeric resin of o-hydroxy benzoic acid and p-xylene (SAX, trade name, a product by Mitsui Toatsu Chemical Co.).

The anti-reflection coating layer is formed by coating a substrate with a coating solution prepared by dissolving the above described essential ingredients, i.e. ultraviolet absorbing agent, crosslinking agent and binder resin, and optional additive ingredients in a suitable organic solvent followed by drying. Suitable organic solvent used in the preparation of the coating solution include ketone solvents such as acetone, methyl ethyl ketone, cyclopentanone, cyclohexanone, methyl isoamyl ketone, 2-heptanone and 1,1,1-trimethyl acetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof, cyclic ethers such as dioxane, and ester solvents such as ethyl lactate, methyl acetate, ethyl acetate, butyl acetate, methyl pyruvate, ethyl pyruvate, methyl 3-methoxy-propionate and ethyl 3-ethoxypropionate. These organic solvents can be used either singly or as a mixture of two kinds or more according to need.

It is further optional that the anti-reflection coating solution contains a surface active agent with an object to improve the coating workability of the solution and to prevent striation in the coating layer. Particularly suitable surface active agents include fluorinated surface active agents sold under the trade names of, for example, Surflons SC-103 and SR-100 (each a product by Asahi Glass Co.), EF-351 (a product by Tohoku Hiryo Co.) and Fluorads Fc-431, Fc-135, Fc-98, Fc-430 and Fc-176 (each a product by Sumitomo 3M Co.). The amount of the surface active agent added to the anti-reflection coating solution does not exceed 2000 ppm by weight based on the amount of the non-volatile ingredients in the coating solution.

The amount of the crosslinking agent in the anti-reflection coating solution is in the range from 10 to 300 parts by weight or, preferably, from 20 to 200 parts by weight per 100 parts by weight of the ultraviolet absorbing agent, when the principal ingredients contained therein are the ultraviolet absorbing agent and the crosslinking agent. When the principal ingredients contained therein are the ultraviolet absorbing agent, crosslinking agent and binder resin, the amount of the ultraviolet absorbing agent is in the range from 10 to 400 parts by weight or, preferably, from 30 to 300 parts by weight and the amount of the crosslinking agent is in the range from 10 to 700 parts by weight or, preferably, from 30 to 600 parts by weight each per 100 parts by weight of the binder resin. Further, it is advantageous that the amount of the ultraviolet absorbing agent is in the range from 5 to 100 parts by weight or, preferably, from 10 to 50 parts by weight per 100 parts by weight of the binder resin, when the principal ingredients contained therein are the ultraviolet absorbing agent and the binder resin. When the compounding proportion of these principal ingredients is outside of the above mentioned ranges, the desired effect for prevention of reflection of the exposure light on the substrate surface cannot be fully exhibited.

In the preparation of the inventive photoresist laminate, a substrate, which is typically a semiconductor silicon wafer, is coated with the above described anti-reflection coating solution by using a suitable coating machine such as spinners followed by drying and a baking treatment at a temperature in the range from 100 to 300° C. to form an anti-reflection coating layer. Thickness of the thus obtained anti-reflection coating layer is not particularly limitative and can be selected depending on the surface condition of the substrate provided that the surface of the substrate can be completely covered by the anti-reflection coating layer. In most cases, the thickness of the anti-reflection coating layer is selected in the range from 0.05 to 0.3 μm.

The anti-reflection coating layer is then overcoated with a photoresist composition to form a photoresist layer thereon. The photoresist composition to give the inventive photoresist laminate is a negative-working chemical-sensitization photoresist composition containing an oximesulfonate compound as the radiation-sensitive acid-generating agent. Namely, the photoresist composition comprises: (1) a film-forming resinous ingredient selected from alkali-soluble resins having phenolic hydroxyl groups and alkali-insolubilized resins derived therefrom by substituting solubility-reducing groups having no reactivity with an acid for a part of the hydroxyl groups; (2) a radiation-sensitive acid-generating agent which is an oximesulfonate compound; and (3) a crosslinkable compound.

The above mentioned alkali-soluble resin having phenolic hydroxyl groups as the component (1) is exemplified by various kinds of novolak resins and poly(hydroxystyrene) resins. The novolak resins can be prepared by a conventional method of condensation reaction between a phenolic compound such as phenol, m-, p- and o-cresols, 2,3-, 2,5- and 3,4-xylenols and 2,3,5-trimethyl phenol and an aldehyde compound such as formaldehyde, paraformaldehyde and trioxane in the presence of an acidic catalyst. The novolak resin preferably has a weight-average molecular weight in the range from 2000 to 30000. When the weight-average molecular weight of the novolak resin is too small, a decrease of the film thickness retention is caused in the development treatment of the resist layer along with deterioration of the cross sectional profile of the patterned resist layer while an adverse effect is caused in the pattern resolution when the weight-average molecular weight of the novolak resin is too large.

The poly(hydroxystyrene) resins as the other class of the component (1) include homopolymers of a hydroxystyrene and copolymers of a hydroxystyrene and another styrene monomer or an acrylic monomer such as (meth)acrylic acid and derivatives thereof. The above mentioned styrene monomers copolymerizable with a hydroxystyrene are exemplified by styrene, p- and o-methylstyrenes, α-methylstyrene, p-methoxystyrene and p-chlorostyrene. The (meth)acrylic acid derivatives copolymerizable with a hydroxystyrene are exemplified by methyl, ethyl, 2-hydroxyethyl and 2-hydroxypropyl (meth)acrylates, (meth)acrylamide and (meth)acrylonitrile. The poly(hydroxystyrene) resin preferably has a weight-average molecular weight in the range from 1000 to 30000. When the weight-average molecular weight of the resin is too small, a decrease of the film thickness retention is caused in the development treatment of the resist layer along with deterioration of the cross sectional profile of the patterned resist layer while an adverse effect is caused in the pattern resolution when the weight-average molecular weight of the resin is too large.

The above mentioned substituent group having no reactivity with an acid, which remains intact in the presence of an acid, includes substituted or unsubstituted benzene sulfonyl groups, substituted or unsubstituted naphthalene sulfonyl groups, substituted or unsubstituted benzene carbonyl groups and substituted or unsubstituted naphthalene carbonyl groups. The substituted or unsubstituted benzene sulfonyl group is exemplified by benzene sulfonyl, chlorobenzene sulfonyl, methylbenzene sulfonyl, ethylbenzene sulfonyl, propylbenzene sulfonyl, methoxybenzene sulfonyl, ethoxybenzene sulfonyl, propoxybenzene sulfonyl and acetaminobenzene sulfonyl groups. The substituted or unsubstituted naphthalene sulfonyl group is exemplified by naphthalene sulfonyl, chloronaphthalene sulfonyl, methylnaphthalene sulfonyl, ethylnaphthalene sulfonyl, propylnaphthalene sulfonyl, methoxynaphthalene sulfonyl, ethoxynaphthalene sulfonyl, propoxynaphthalene sulfonyl and acetaminonaphthalene sulfonyl groups. The substituted or unsubstituted benzene carbonyl and naphthalene carbonyl groups are exemplified by the above named benzene sulfonyl and naphthalene sulfonyl groups after replacement of the sulfonyl group —$SO_2$— with a carbonyl group —CO—.

The degree of substitution of these acid-inactive substituent groups for the hydroxyl groups in the alkali-soluble resin is in the range from 0.01 to 1% or, preferably, from 0.08 to 0.15%.

The hydroxyl group-containing alkali-soluble resin as the component (1) is preferably a poly(hydroxystyrene) resin or, more preferably, a homopolymeric poly(hydroxystyrene) resin or a copolymeric resin of p-hydroxystyrene and styrene, among the above described resins. The resin alkali-insolubilized by the substitution of acid-inactive groups for a part of the hydroxyl groups is preferably a poly (hydroxystyrene) resin after substitution of acetaminobenzene sulfonyl groups for a part of the hydroxyl groups in respect of the high photo-sensitivity and high pattern resolution of the photoresist composition formulated therewith.

The component (2) in the photoresist composition is an oximesulfonate compound as an acid-generating agent which is exemplified by:

those disclosed in U.S. Pat. No. 4,540,598 such as
α-(p-toluenesulfonyloxyimino)phenyl acetonitrile;
α-(4-chlorobenzenesulfonyloxyimino)phenyl acetonitrile;
α- (4-nitrobenzenesulfonyloxyimino)phenyl acetonitrile;
α-(4-nitro-2-trifluoromethylbenzenesulfonyloxyimino) phenyl acetonitrile;
α-(benzenesulfonyloxyimino)-4-chlorophenyl acetonitrile;
α-(benzenesulfonyloxyimino)-2,4-dichlorophenyl acetonitrile;
α-(benzenesulfonyloxyimino)-2,6-dichlorophenyl acetonitrile;
α-(benzenesulfonyloxyimino)-4-methoxyphenyl acetonitrile;
α-(2-chlorobenzenesulfonyloxyimino)-4-methoxyphenyl acetonitrile;
α-(benzenesulfonyloxyimino)-2-thienyl acetonitrile;
α-(4-dodecylbenzenesulfonyloxyimino)phenyl acetonitrile;
α- (p-toluenesulfonyloxyimino)-4-methoxyphenyl acetonitrile;
α- (4-dodecylbenzenesulfonyloxyimino)-4-methoxyphenyl acetonitrile; and
α-(tolylsulfonyloxyimino)-3-thienyl acetonitrile;

those compounds represented by the general formula $$R^1-C(CN)=N-O-SO_2-R^2, \quad (II)$$

in which $R^1$ is an aromatic group and $R^2$ is an alkyl group having 1 to 4 carbon atoms or a halogenated alkyl group having 1 to 4 carbon atoms, such as α-(methylsulfonyloxyimino)phenyl acetonitrile;
α-(methylsulfonyloxyimino)-4-methoxyphenyl acetonitrile;
α-(trifluoromethylsulfonyloxyimino)phenyl acetonitrile;
α-(tritluoromethylsulfonyloxyimino)-4-methoxyphenyl acetonitrile;
α-(ethylsulfonyloxyimino)-4-methoxyphenyl acetonitrile;
α-(propylsulfonyloxyimino)-4-methylphenyl acetonitrile; and
α-(methylsulfonyloxyimino)-4-bromophenyl acetonitrile;

those compounds represented by the general formulas $$R^9-C(CN)=N-O-SO_2-R^{10}, \quad (III)$$

in which $R^9$ and $R^{10}$ are each a substituted or unsubstituted non-aromatic group having 1 to 12 carbon atoms.

The group denoted by $R^9$ is preferably cycloalkenyl group of 5 to 7 carbon atoms exemplified by cyclopentenyl, cyclohexenyl and cycloheptenyl groups while $R^{10}$, having 1 to 4 carbon atoms, is preferably a lower alkyl or halogenated lower alkyl group.

Particular examples of the oximesulfonate compound expressed by the general formula (III) include:

α-(methylsulfonyloxyimino)-1-cyclopentenyl acetonitrile;
α-(methylsulfonyloxyimino)-1-cyclohexenyl acetonitrile;
α-(methylsulfonyloxyimino)-1-cycloheptenyl acetonitrile;
α-(methylsulfonyloxyimino)-1-cyclooctenyl acetonitrile;
α-(trifluoromethylsulfonyloxyimino)-1-cyclopentenyl acetonitrile;
α-(trifluoromethylsulfonyloxyimino)-1-cyclohexenyl acetonitrile;
α-(ethylsulfonyloxyimino)ethyl acetonitrile;
α-(propylsulfonyloxyimino)propyl acetonitrile;
α-(cyclohexylsulfonyloxyimino)cyclopentyl acetonitrile;
α-(cyclohexylsulfonyloxyimino)cyclohexyl acetonitrile; and
α-(cyclohexylsulfonyloxyimino)-1-cyclopentenyl acetonitrile.

Besides, the oximesulfonate compounds expressed by the general formula $$A[-C(CN)=N-O-SO_2-R^{11}]_n, \quad (IV)$$

in which the subscript n is 2 or 3, A is a divalent, when n is 2, or tervalent, when n is 3, organic group and $R^{11}$ is a substituted or unsubstituted aromatic or non-aromatic hydrocarbon group of 1 to 12 carbon atoms, can also be used.

The group denoted by $R^{11}$ is preferably a lower alkyl or lower halogenated alkyl group of 1 to 4 carbon atoms, cycloalkyl, alkyl-substituted phenyl or alkoxy-substituted phenyl group of 5 to 7 carbon atoms. The divalent or tervalent organic group denoted by A is a phenylene or alkylene group, in which a phenylene group is preferable.

Particular examples of the oximesulfonate compound expressed by the general formula (IV) include the compounds expressed by the following structural formulas, in which Me is a methyl group, Et is an ethyl group, Bu is a butyl group, Ch is a cyclohexyl group, Ph is a phenyl group, fMe is a trifluoromethyl group, pPn is a 1,4-phenylene group and mPn is a 1,3-phenylene group:

Me—SO$_2$—O—N=C(CN)—pPn—C(CN)=N—O—SO$_2$—Me;

Me—SO$_2$—O—N=C(CN)—mPn—C(CN)=N—O—SO$_2$—Me;

Et—SO$_2$—O—N=C(CN)—pPn—C(CN)=N—O—SO$_2$—Et;

Bu—SO$_2$—O—N=C(CN)—mPn—C(CN)=N—O—SO$_2$—Bu;

Bu—SO$_2$—O—N=C(CN)—pPn—C(CN)=N—O—SO$_2$—Bu;

fMe—SO$_2$—O—N=C(CN)—pPn—C(CN)=N—O—SO$_2$—fMe;

fMe—SO$_2$—O—N=C(CN)—mPn—C(CN)=N—O—SO$_2$—fMe;

Ch—SO$_2$—O—N=C(CN)—pPn—C(CN)=N—O—SO$_2$—Ch;

Ph—SO$_2$—O—N=C(CN)—pPn—C(CN)=N—O—SO$_2$—Ph;

Me—pPn—SO$_2$—O—N=C(CN)—pPn—C(CN)=N—O—SO$_2$—pPn—Me;

Me—pPn—SO$_2$—O—N=C(CN)—mPn—C(CN)=N—O—SO$_2$—pPn—Me; and

MeO—pPn—SO$_2$—O—N=C(CN)—mPn—C(CN)=N—O—SO$_2$—pPn—OMe.

While the photoresist composition used in the invention essentially contains an oximesulfonate compound as a radiation-sensitive acid-generating agent, the oximesulfonate compound is preferably selected from those expressed by the above given general formulas (II), (III) and (IV) or, more preferably in respect of the photosensitivity of the composition, selected from those expressed by the general formula (II) exemplified by:

α-(methylsulfonyloxyimino)phenyl acetonitrile;
α-(methylsulfonyloxyimino)-4-methoxyphenyl acetonitrile;
α-(trifluoromethylsulfonyloxyimino)phenyl acetonitrile;
α-(trifluoromethylsulfonyloxyimino)-4-methoxyphenyl acetonitrile;
α-(ethylsulfonyloxyimino)-4-methoxyphenyl acetonitrile;
α-(propylsulfonyloxyimino)-4-methylphenyl acetonitrile; and
α-(methylsulfonyloxyimino)-4-bromophenyl acetonitrile
along with the advantages of absence of necking in the patterned resist layer with an excellently orthogonal cross sectional profile.

It is of course optional to use the above described oximesulfonate compounds either singly or as a combination of two kinds or more according to need. The acid-generating agent used in the invention can also be a combination of one or more of the above described oximesulfonate compounds with other conventional acid-generating agents including onium salt compounds and halogenated compound of which, if used, tris(2,3-dibromopropyl) isocyanurate is preferred.

Further, the crosslinkable compound as the component (3) in the photoresist composition is not particularly limitative and can be selected from those conventionally formulated in negative-working chemical-sensitization photoresist compositions of the prior art. Suitable crosslinkable compounds include amino resins such as melamine resins, urea resins, guanamine resins, glycoluryl-formaldehyde resins, succinylamide-formaldehyde resins, ethyleneurea-formaldehyde resins and the like having hydroxyl and/or alkoxy groups. Such a functional amino resin can be easily prepared by the reaction of formaldehyde with melamine, urea, guanamine, glycoluryl, succinylamide, ethyleneurea and the like in boiling water to effect methylolation, optionally, followed by the reaction with a lower alcohol to effect alkoxylation. Several grades of commercial products of this class are available and can be used as such including Nicalacs Mx-750, Mx-290 and Mw-30 (each a product by Sanwa Chemical Co.).

Besides the above described functional amino resins, usable crosslinkable compounds include benzene compounds having alkoxy groups in the molecule such as 1,3,5-tris-(methoxymethoxy) benzene, 1,2,4-tris (isopropoxymethoxy) benzene and 1,4-bis(sec-butoxymethoxy) benzene and phenol compounds having non-phenolic hydroxyl and/or alkoxy groups such as 2,6-dihydroxymethyl p-cresol and 2,6-dihydroxymethyl p-tert-butylphenol.

The above described crosslinkable compounds can be used either singly or as a combination of two kinds or more according to need. The amount of the crosslinkable compound as the component (3) in the negative-working chemical-sensitization photoresist composition is in the range from 3 to 70 parts by weight or, preferably, from 5 to 50 parts by weight per 100 parts by weight of the film-forming resinous ingredient as the component (1) in respect of the film formability and photosensitivity of the photoresist composition and developability of the photoresist layer after pattern-wise exposure to actinic rays. When the amount of the crosslinkable compound is too small, the photosensitivity of the composition is unduly decreased while, when the amount thereof is too large, a photoresist layer of good film properties can hardly be obtained from the composition along with a decrease in the developability of the photoresist layer.

The amount of the oximesulfonate compound as the component (2) in the negative-working chemical-sensitization photoresist composition is in the range from 0.1 to 30 parts by weight or, preferably, from 1 to 20 parts by weight per 100 parts by weight of the total amount of the film-forming resinous ingredient as the component (1) and the crosslinkable compound as the component (3) in respect of the imageability and developability of the photoresist layer. When the amount of the oximesulfonate compound is too small or too large, the photoresist composition cannot exhibit good performance in the imageability and developability.

The negative-working chemical-sensitization photoresist composition used in the preparation of the inventive photoresist laminate is prepared by dissolving the above described essential ingredients and optional additives in a suitable organic solvent which is exemplified by ketone solvents such as acetone, methyl ethyl ketone, cyclopentanone, cyclohexanone, methyl isoamyl ketone, 2-heptanone and 1,1,1-trimethyl acetone, polyhydric alcohols and derivatives thereof such as ethyleneglycol, ethyleneglycol monoacetate, diethyleneglycol, diethyleneglycol monoacetate, propyleneglycol and propyleneglycol monoacetate as well as monomethyl, monoethyl, monopropyl, monobutyl and monophenyl ethers thereof, cyclic ether solvents such as dioxane, and ester solvents such as ethyl lactate, methyl acetate, ethyl acetate, butyl acetate, methyl pyruvate, ethyl pyruvate, methyl 3-methoxypropionate and ethyl 3-ethoxypropionate. These organic solvents can be used either singly or as a mixture of two kinds or more according to need.

The above mentioned optional additives to the photoresist composition include auxiliary resins to improve the film properties of the photoresist layer, plasticizers, stabilizers, coloring agents, surface active agents and the like having compatibility with the other ingredients.

The photoresist laminate of the invention is prepared by uniformly applying the photoresist composition prepared in the above described manner to the anti-reflection coating layer formed in advance on the surface of a substrate by a known coating method such as spin coating, doctor knife coating and the like followed by drying to give a photoresist laminate having a thickness, usually, in the range from 0.5 to 5 μm.

In the next place, a description is given of the patterning method by using the photoresist laminate prepared in the above described manner. By utilizing the photolithographic technology in the prior art, firstly, the photoresist layer of the laminate is exposed pattern-wise to actinic rays such as i-line light of 365 nm wavelength, deep ultraviolet light, excimer laser beams and the like through a pattern-bearing photomask on a exposure machine such as a minifying projection exposure machine to form a latent image of the pattern in the photoresist layer which is then subjected to a post-exposure baking treatment. The latent image in the photoresist layer is developed by using an aqueous alkaline solution such as a 1 to 10% by weight aqueous solution of tetramethylammonium hydroxide as a developer solution to dissolve away the resist layer in the areas unexposed to the actinic rays to expose bare the anti-reflection coating layer leaving a negatively patterned resist layer on the underlying anti-reflection coating layer in the areas exposed to the actinic rays. The thus pattern-wise exposed bare anti-reflection coating layer is then removed by dry etching such as plasma etching with the negatively patterned resist layer as an etching mask.

Use of a phase-shift photomask as the pattern-bearing photomask is advantageous in the pattern formation with the inventive photoresist laminate because a patterned resist layer having high fidelity can be obtained thereby. It is particularly advantageous to use an alternating-type phase-shift photomask in order to form a line-and-space pattern of the resist layer of high fidelity having an excellently orthogonal cross sectional profile from the inventive photoresist laminate.

In the following, the photoresist laminate and the patterning method according to the present invention are described in more detail by way of Examples and Comparative Examples which, however, never limit the scope of the invention in any way.

EXAMPLE 1

An anti-reflection coating solution was prepared by dissolving, in 150 g of propyleneglycol monomethyl ether acetate, 5 g of a commercial melamine resin (Mx-750, supra) substituted by 3.7 methoxymethyl groups on an average per melamine ring, 3 g of 4,4'-bis(diethylamino) benzophenone and 5 g of 2,2', 4,4'-tetrahydroxy benzophenone to give a uniform solution which was admixed with a fluorinated surface active agent in an amount of 0.1% by weight based on the amount of the non-volatile ingredient in the solution followed by filtration through a membrane filter of 0.2 $\mu$m pore diameter.

A semiconductor silicon wafer was uniformly coated with the thus prepared anti-reflection coating solution on a spinner followed by drying at 90° C. for 90 seconds and a baking treatment at 180° C. for 2 minutes to give an anti-reflection coating layer having a thickness of 0.15 $\mu$m.

Separately, a negative-working chemical-sensitization photoresist composition was prepared by dissolving, in 480 parts by weight of propyleneglycol monomethyl ether acetate, 100 parts by weight of a copolymeric resin of hydroxystyrene and styrene having a weight-average molecular weight of 2500 and 15 parts by weight of a commercially obtained melamine resin (Mw-30, a product by Sanwa Chemical Co.) to give a solution which was further admixed with 3 parts by weight of α-(methylsulfonyloxyimino)phenyl acetonitrile as an acid-generating agent.

The thus prepared photoresist composition was applied to the above obtained anti-reflection coating layer by using a spinner followed by drying at 90° C. for 90 seconds to give a negative-working photoresist layer having a thickness of 1.00 $\mu$m.

In the next place, this photoresist layer of the thus prepared photoresist laminate was pattern-wise exposed to i-line light through an alternating-type phase-shift photomask on an exposure machine (Model NSR-2005i10D, manufactured by Nikon Co.) followed by a post-exposure baking treatment at 110° C. for 90 seconds and then subjected to a development treatment with a 2.38% by weight aqueous solution of tetramethylammonium hydroxide for 65 seconds followed by rinse with water for 30 seconds and drying. The thus obtained line-and-space patterned resist layer of 0.30 $\mu$m line width was examined on a scanning electron microscopic photograph for the cross sectional profile to find that the cross sectional profile was excellently orthogonal standing upright on the anti-reflection coating layer absolutely without necking in the patterned resist layer.

The photoresist laminate after patterning of the photoresist layer was subjected to a dry etching treatment in a plasma etching apparatus (Model TUE-1102, manufactured by Tokyo Ohka Kogyo Co.) in an atmosphere of chlorine gas under a pressure of 30 mTorr at a temperature of 20° C. with a power output of 150 watts for 70 seconds to remove the exposed anti-reflection coating layer so that a pattern having high fidelity to the photomask pattern with high dimensional accuracy was obtained on the substrate surface.

EXAMPLE 2

The procedure for the formation of a pattern on the surface of a silicon wafer was substantially the same as in Example 1 except that the anti-reflection coating solution was further admixed with 1.3 g of a 1:1 by weight copolymer of glycidyl methacrylate and methyl methacrylate having a weight-average molecular weight of 60000 and an increase of the amount of propyleneglycol monomethyl ether acetate from 150 g to 190 g.

The line-and-space patterned resist layer of 0.30 $\mu$m line width formed by the development treatment had an excellently orthogonal cross sectional profile standing upright on the anti-reflection coating layer absolutely without necking in the patterned resist layer. The pattern on the substrate surface obtained by the dry etching treatment of the exposed anti-reflection coating layer had high fidelity to the photomask pattern with high dimensional accuracy.

EXAMPLE 3

The procedure for the formation of a pattern on the surface of a silicon wafer was substantially the same as in Example 1 excepting for the replacement of α-(methylsulfonyloxyimino)phenyl acetonitrile as the acid-generating agent in the photoresist composition with the same amount of α-(p-toluenesulfonyloxyiminotphenyl acetonitrile.

The line-and-space patterned resist layer of 0.30 $\mu$m line width formed by the development treatment had an excellently orthogonal cross sectional profile standing upright on the anti-reflection coating layer absolutely without necking in the patterned resist layer. The pattern on the substrate surface obtained by the dry etching treatment of the exposed anti-reflection coating layer had high fidelity to the photomask pattern with high dimensional accuracy.

EXAMPLE 4

The procedure for the formation of a pattern on the surface of a silicon wafer was substantially the same as in Example 1 excepting for the replacement of α-(methylsulfonyloxyimino)phenyl acetonitrile as the acid-generating agent in the photoresist composition with the same amount of α-(methylsulfonyloxyimino)-4-methoxyphenyl acetonitrile.

The line-and-space patterned resist layer of 0.30 $\mu$m line width formed by the development treatment had an excellently orthogonal cross sectional profile standing upright on the anti-reflection coating layer absolutely without necking in the patterned resist layer. The pattern on the substrate surface obtained by the dry etching treatment of the exposed anti-reflection coating layer had high fidelity to the photomask pattern with high dimensional accuracy.

EXAMPLE 5

The procedure for the formation of a pattern on the surface of a silicon wafer was substantially the same as in Example 1 excepting for the replacement of α-(methylsulfonyloxyimino)phenyl acetonitrile as the acid-generating agent in the photoresist composition with the same amount of another oximesulfonate compound expressed by the structural formula

in which each symbol has the same meaning as defined before.

The line-and-space patterned resist layer of 0.30 μm line width formed by the development treatment had an excellently orthogonal cross sectional profile standing upright on the anti-reflection coating layer without necking in the patterned resist layer. The pattern on the substrate surface obtained by the dry etching treatment of the exposed anti-reflection coating layer had high fidelity to the photomask pattern with high dimensional accuracy.

EXAMPLE 6

The procedure for the formation of a pattern on the surface of a silicon wafer was substantially the same as in Example 1 excepting for the replacement of the anti-reflection coating solution with another anti-reflection coating solution prepared by dissolving, in 100 g of propyleneglycol monomethyl ether acetate, 10 g of a 1:1 by weight copolymer of glycidyl methacrylate and methyl methacrylate having a weight-average molecular weight of 100000 and 3 g of 2,2', 4,4'-tetrahydroxy-benzophenone.

The line-and-space patterned resist layer of 0.30 μm line width formed by the development treatment had an excellently orthogonal cross sectional profile standing upright on the anti-reflection coating layer without necking in the patterned resist layer. The pattern on the substrate surface obtained by the dry etching treatment of the exposed anti-reflection coating layer had high fidelity to the photomask pattern with high dimensional accuracy.

EXAMPLE 7

An anti-reflection coating solution was prepared by dissolving, in 190 g of propyleneglycol monomethyl ether, 8 g of a benzoguanamine compound (Cymel 1123, supra) as a crosslinking agent, 2 g of bis(4-hydroxyphenyl) sulfone and 4 g of a polymer of 4-(4-hydroxyphenyl)sulfonylphenyl methacrylate having a weight-average molecular weight of 3000 to 4000 followed by filtration of the solution through a membrane filter of 0.2 μm pore diameter.

A semiconductor silicon wafer was uniformly coated with the thus prepared anti-reflect on coating solution on a spinner followed by drying at 90° C. for 90 seconds and a baking treatment at 180° C. for 2 minutes to give an anti-reflection coating layer having a thickness of 0.20 μm.

Separately, a negative-working chemical-sensitization photoresist composition was prepared by dissolving, in 550 parts by weight of propyleneglycol monomethyl ether, 100 parts by weight of a copolymeric resin of hydroxystyrene and styrene having a weight-average molecular weight of 2500, 5 parts by weight of a commercially obtained melamine resin (Mw-30, supra) and 5 parts by weight of a commercially obtained urea resin (Mw-290, a product of Sanwa Chemical Co.) to give a solution which was further admixed with 3 parts by weight of α-(methylsulfonyloxyimino)-4-methoxyphenyl acetonitrile as an acid-generating agent.

The thus prepared photoresist composition was applied to the above obtained anti-reflection coating layer by using a spinner followed by drying at 90° C. for 90 seconds to give a negative-working photoresist layer having a thickness of 1.00 μm.

In the next place, this photoresist layer of the thus prepared photoresist laminate was pattern-wise exposed to light through an alternating-type phase-shift photomask on an exposure machine (Model NSR-2005Ex8A, manufactured by Nikon Co.) followed by a post-exposure baking treatment at 110° C. for 90 seconds and then subjected to a development treatment with a 2.38% by weight aqueous solution of tetramethylammonium hydroxide for 65 seconds followed by rinse with water for 30 seconds and drying. The thus obtained line-and-space patterned resist layer of 0.18 μm line width was examined on a scanning electron microscopic photograph for the cross sectional profile to find that the cross sectional profile was excellently orthogonal standing upright on the anti-reflection coating layer absolutely without necking in the patterned resist layer. The pattern on the substrate surface obtained by the dry etching treatment of the exposed anti-reflection coating layer in the same manner as in Example 1 had high fidelity to the photomask pattern with high dimensional accuracy.

EXAMPLE 8

The procedure for the formation of a pattern on the surface of a silicon wafer was substantially the same as in Example 7 excepting for the replacement of the anti-reflection coating solution with another anti-reflection coating solution prepared by dissolving, in 190 g of propyleneglycol monomethyl ether acetate, 8 g of a commercial benzoguanamine resin (Cymel 1125, a product by Mitsui Cyanamide Co.) and 6 g of bis(4-hydroxyphenyl) sulfone followed by filtration of the solution through a membrane filter of 0.2 μm pore diameter.

The line-and-space patterned resist layer of 0.18 μm line width formed by the development treatment had an excellently orthogonal cross sectional profile standing upright on the anti-reflection coating layer without necking in the patterned resist layer. The pattern on the substrate surface obtained by the dry etching treatment of the exposed anti-reflection coating layer in the same manner as in Example 1 had high fidelity to the photomask pattern with high dimensional accuracy.

COMPARATIVE EXAMPLE 1

The procedure for the formation of a pattern on the surface of a silicon wafer was substantially the same as in Example 7 excepting for the replacement of α-(methylsulfonyloxyimino)-4-methoxyphenyl acetonitrile as the acid-generating agent in the photoresist composition with the same amount of tris(2,3-dibromopropyl) isocyanurate.

The line-and-space patterned resist layer of 0.18 μm line width formed by the development treatment indicated remarkable necking in the patterned resist layer. The pattern on the substrate surface obtained by the dry etching treatment of the exposed anti-reflection coating layer had poor dimensional accuracy as compared with Example 7.

What is claimed is:

1. A method for the formation of a patterned resist layer on the surface of a substrate which comprises the steps of:

(A) exposing, pattern-wise to actinic rays through a phase shift photomask, the photoresist layer of a photoresist laminate comprising
   (a) a substrate;
   (b) an anti-reflection coating layer comprising, as a uniform mixture, an ultraviolet absorbing compound and either one or both of a crosslinking agent and a binder resin, said anti-reflection coating layer being formed on one surface of the substrate; and
   (c) a photoresist layer formed on the anti-reflection coating layer from a negative-working chemical-sensitization photoresist composition comprising, as a uniform mixture:
      (1) a film-forming resinous ingredient which is an alkali-soluble resin having phenolic hydroxyl groups or a resin having phenolic hydroxyl groups insolubilized in an alkali by substitution for a part of the hydroxyl groups by solubility-reducing substituent groups having no reactivity with an acid;
      (2) an oximesulfonate compound as an acid-generating agent; and
      (3) a crosslinkable compound;

(B) subjecting the photoresist layer to a heat treatment;

(C) subjecting the photoresist layer to a development treatment to dissolve away the photoresist layer in the areas unexposed to actinic rays in step (A) to pattern-wise expose the anti-reflection coating layer in the areas unexposed to the actinic rays leaving a patterned resist layer in the areas exposed to actinic rays; and (D) removing the anti-reflection coating layer exposed pattern-wise by dry etching with the patterned photoresist layer as an etching mask.

* * * * *

UNITED STATES PATENT AND TRADEMARK OFFICE
CERTIFICATE OF CORRECTION

PATENT NO. : 6,083,665
DATED : July 4, 2000
INVENTOR(S) : Mitsuru Sato et al.

Page 1 of 1

It is certified that error appears in the above-identified patent and that said Letters Patent is hereby corrected as shown below:

Column 4,
Line 66, change "bis (3,5-dimeth 1-4-" to --bis (3,5-dimethyl-4- --.

Signed and Sealed this

Tenth Day of July, 2001

Attest:

NICHOLAS P. GODICI
Attesting Officer
Acting Director of the United States Patent and Trademark Office